(12) United States Patent
Aggarwal et al.

(10) Patent No.: US 6,696,367 B1
(45) Date of Patent: Feb. 24, 2004

(54) SYSTEM FOR THE IMPROVED HANDLING OF WAFERS WITHIN A PROCESS TOOL

(75) Inventors: Ravinder Aggarwal, Gilbert, AZ (US); Jim Kusbel, Fountain Hills, AZ (US); Jim Alexander, Tempe, AZ (US)

(73) Assignee: ASM America, Inc., Phoenix, AZ (US)

( * ) Notice: Subject to any disclaimer, the term of this patent is extended or adjusted under 35 U.S.C. 154(b) by 0 days.

(21) Appl. No.: 10/260,821

(22) Filed: Sep. 27, 2002

(51) Int. Cl.[7] .................. H01L 21/31; H01L 21/469
(52) U.S. Cl. .................. 438/758; 438/800; 414/935; 414/937; 414/940
(58) Field of Search .................. 438/758, 800, 438/908; 414/935, 937, 940

(56) References Cited

U.S. PATENT DOCUMENTS

| | | | |
|---|---|---|---|
| 4,951,601 A | | 8/1990 | Maydan et al. |
| 5,176,493 A | | 1/1993 | Toro-Lira et al. |
| 5,586,585 A | * | 12/1996 | Bonora et al. ............... 141/93 |
| 5,664,925 A | | 9/1997 | Muka et al. |
| 5,944,857 A | | 8/1999 | Edwards et al. |
| 5,970,717 A | | 10/1999 | Tateyama |
| 5,974,682 A | | 11/1999 | Akimoto |
| 5,988,233 A | * | 11/1999 | Fosnight et al. ............. 141/63 |
| 6,034,000 A | | 3/2000 | Heyder et al. |
| 6,042,623 A | | 3/2000 | Edwards |
| 6,079,927 A | | 6/2000 | Muka |
| 6,183,564 B1 | * | 2/2001 | Reynolds et al. ............ 118/719 |
| 6,257,827 B1 | | 7/2001 | Hendrickson et al. |
| 6,286,230 B1 | * | 9/2001 | White et al. ................. 34/403 |
| 2002/0006677 A1 | * | 1/2002 | Egermeier et al. ............ 438/14 |
| 2002/0015633 A1 | * | 2/2002 | Fosnight et al. ....... 414/222.01 |

OTHER PUBLICATIONS

SEMI E62–0997 Provisional Specification for 300–mm Front–Opening Interface Mechanical Standard (FIMS).

* cited by examiner

*Primary Examiner*—Alexander Ghyka
(74) *Attorney, Agent, or Firm*—Knobbe, Martens, Olson & Bear, LLP

(57) ABSTRACT

A substrate fabrication system is provided which includes a buffer station located inline between a front docking port and a loadlock chamber, the buffer station being operatively joined with a front handling chamber. Preferred embodiments employ a buffer station having a rack with reduced pitch, or relative spacing between shelves. Additional embodiments provide variable pitch end effectors as part of the disclosed fabrication system. Methods of fabricating wafers by quickly transferring them to purgeable buffer stations upon wafers arriving at a docking port are also provided.

14 Claims, 7 Drawing Sheets

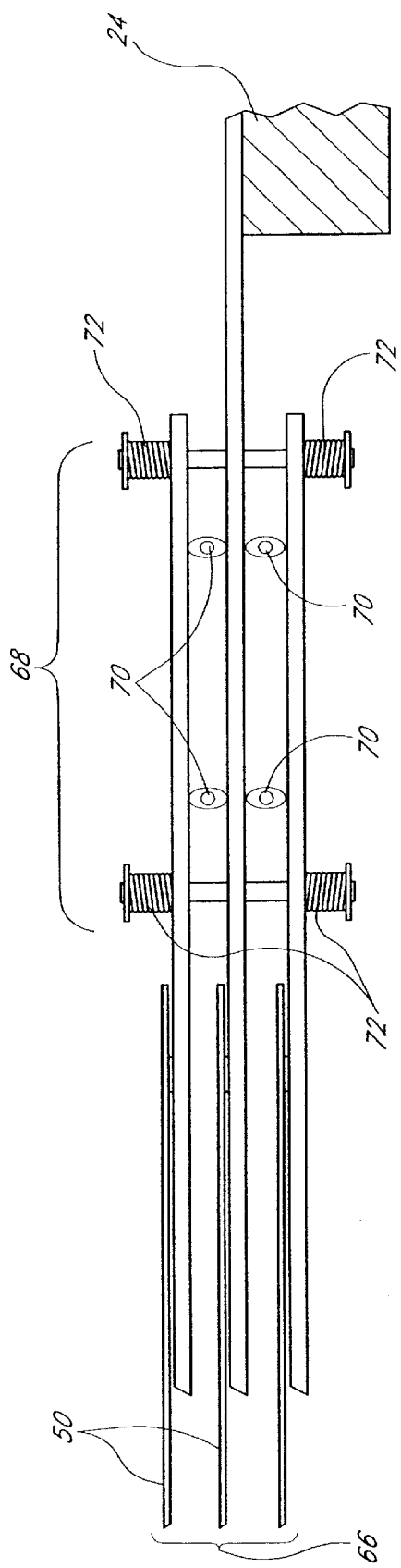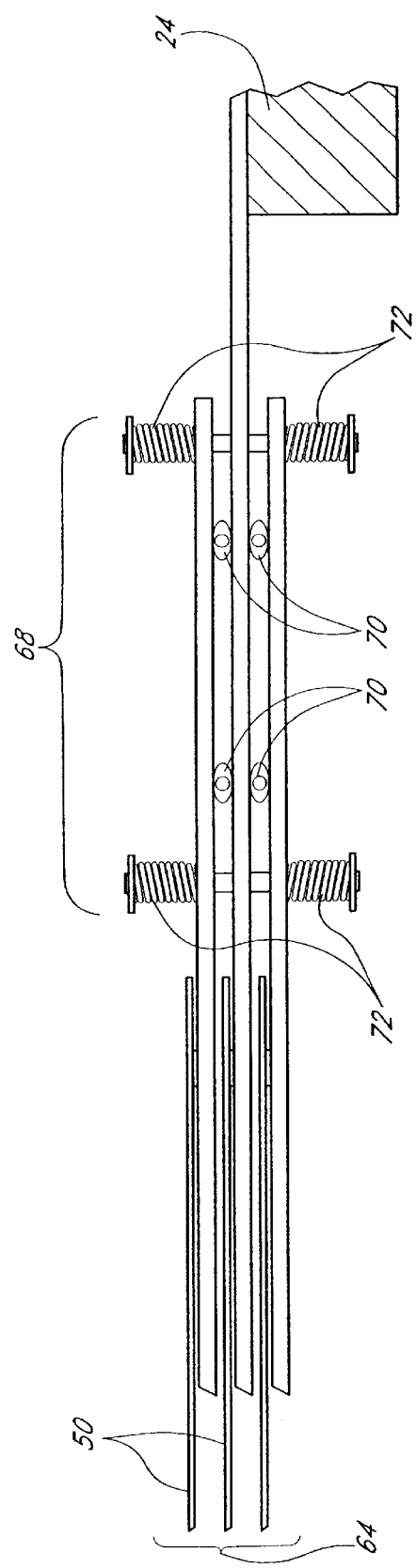

US 6,696,367 B1

SYSTEM FOR THE IMPROVED HANDLING OF WAFERS WITHIN A PROCESS TOOL

FIELD OF THE INVENTION

The present invention relates generally to semiconductor fabrication, and more particularly to improved wafer handling systems.

BACKGROUND OF THE INVENTION

Semiconductor wafers or other such substrates typically arrive at the input of a process tool as a group carried in a wafer carrier and from this input must be transported among the internal stations of a process tool. In furtherance of this task, wafer handling systems facilitate the transfer of wafers from one station to another. During this process, it is very important that the wafer be kept isolated from contamination. The presence of contaminant particles on the surface of a wafer can lead to the formation of defects during the fabrication process. Therefore, the wafers must be moved between isolated interior chambers of a process tool in such away as to minimize contamination of both the wafers themselves and the possibility of the cross contamination of chambers.

In furtherance of minimizing wafer contamination, it is desirable to minimize the amount of time a wafer is exposed to contaminants. One way to minimize contaminants is to use standardized front opening unified pods (FOUPs).

Another approach to minimizing wafer exposure to the ambient environment (e.g., clean room) is to use a large capacity loadlock chamber (e.g., 25 wafers) capable of receiving an entire cassette or FOUP of wafers. However, large capacity loadlock chambers pose a number of problems including requiring complex elevator mechanisms, which require an even larger volume. The elevator mechanisms require extra chamber "headroom" in order to have space to raise and lower the load of wafers, allowing access by single wafer robots. Due to the large internal volume of high capacity loadlock chambers, longer purge cycles are necessary to remove potentially wafer damaging agents, such as oxygen and moisture. During these purge cycles, wafer processing is delayed while waiting on the completion of the purging. In systems where two loadlock chambers are employed the footprint of the fabrication tool can also increase substantially. In addition, the use of an elevator mechanism reduces the uptime and system availability, and further increases the risk of particle generation caused by the moving components of the elevator.

Wafer handling systems typically employ robot arms in order to effectively transfer wafers between stations. On the end of each of these arms, an end effector is configured to gain access to a wafer at a first station, lift the wafer, transport the wafer, gain access to the second station, and then deposit the wafer at the second station.

The cost of processing semiconductor wafers, always a prime consideration, is often evaluated by the throughput per unit of cost. Another measure of cost is the throughput per area of floor space, wherein it is desirable to reduce the footprint of the apparatus employed. Related to both is the importance of reducing the capital cost of the equipment. In an industry in which the speed of processing is directly related to output, additional handling steps slow down the fabrication line. Therefore, advancements that can improve the competitive edge by either measure are highly desirable.

SUMMARY OF THE INVENTION

In accordance with one aspect of the present invention, a semiconductor processing tool is provided comprising a first substrate handling chamber, a front docking port located on the outside surface of the first substrate chamber, and a robot arm located in the front wafer handling chamber. In addition, a loadlock chamber is joined to the first substrate handling chamber and a buffer station is located between the loadlock chamber and the front docking ports. The buffer station is configured to provide a less contaminated inert internal environment as compared with the internal environment of a cassette docked to the docking port. The buffer station also has a rack configured to have multiple shelves for holding substrates.

In accordance with one aspect of the present invention, a method of fabricating an integrated circuit is also provided comprising first docking a substrate cassette with a front docking port of a process tool. A substrate is then transferred to a buffer station located between the docking port and a loadlock chamber and the buffer station is then purged. The substrate is then moved from the buffer station to the loadlock chamber.

Preferred embodiments of the present invention employ a buffer station having a rack with reduced pitch, or relative spacing between shelves, as compared to standard cassettes or FOUPs for the same size of substrate. Thus, the preferred buffer stations have a low volume that can be quickly and efficiently purged to provide a clean, nonoxidizing environment.

The preferred embodiments offer many advantages. Embodiments employing buffer chambers, which are small and easily purged, serve as quickly accessible and less contaminated chambers to temporarily store wafers during processing. Reduced pitch buffer station racks also enable access to all shelves by a standard robot arm, without the need for a internal elevator mechanism in the buffer stations. Consequently, the absence of the extra movement inherent with an internal elevator decreases the generation of contaminants inside the process tool.

Certain preferred embodiments employ a variable pitch end effector in order to adjust the relative spacing of the end effector wafer supports. This allows the end effector to simultaneously transfer a plurality of wafers between racks, even though the racks have a different relative spacings between support slots shelves.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

All of these embodiments are intended to be within the scope of the invention herein disclosed. These and other embodiments of the present invention will become readily apparent to those skilled in the art from the following detailed description of the preferred embodiments having reference to the attached figures, the invention not being limited to any particular preferred embodiment(s) disclosed.

BRIEF DESCRIPTION OF THE DRAWINGS

FIG. 6A shows a variable pitch end effector, employing cams in accordance with one embodiment of the present invention, in a standard pitch position.

FIG. 6B shows the variable pitch end effector of FIG. 6A in a reduced pitch position.

DETAILED DESCRIPTION OF THE PREFERRED EMBODIMENTS

Figure 1:
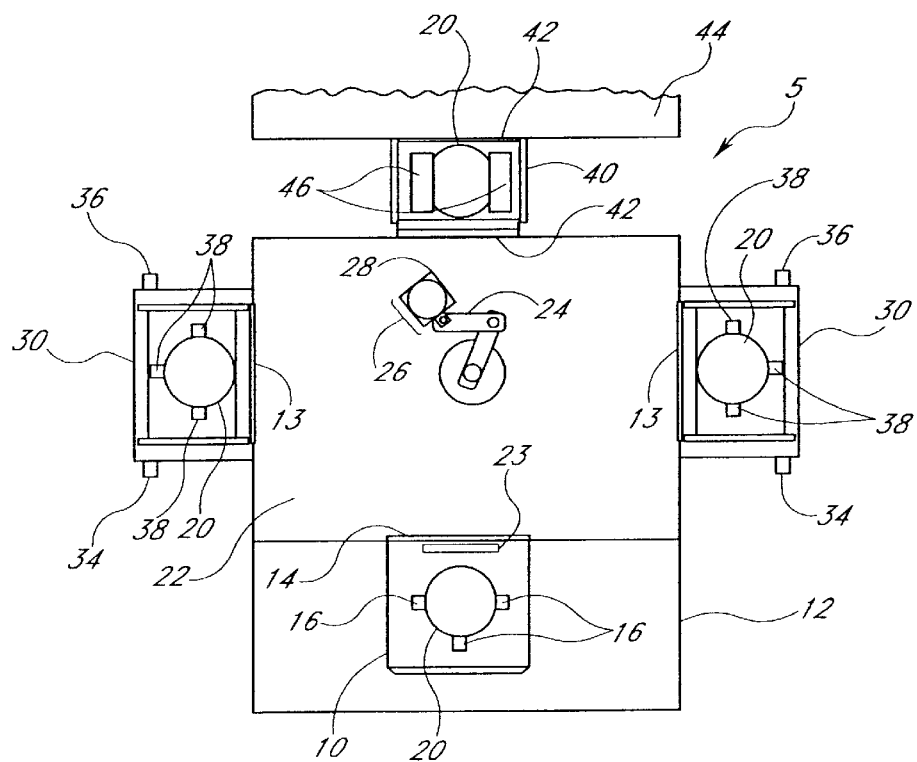
FIG. 1 is a schematic plan view showing a section of a semiconductor process tool, constructed in accordance with a preferred embodiment of the present invention.

Maximizing throughput while limiting both wafer handling and the exposure of a wafer to contamination are paramount goals, which preferred embodiments of the present invention advance. Long wafer handling times greatly limit a process tool's throughput. This limitation on throughput is not the only negative effect of longer wafer handling times, because the majority of the wafers must be left exposed to the ambient environment of the clean room, as compared to the more controlled environment within the process tool, while a batch is transferred. This long exposure can be unacceptable when a wafer must be transferred quickly to protect delicate surface conditions or to prevent growth of an unwanted native oxide layer. Even the intermediate purity levels defined between an enclosed front end interface chamber and a docked front opening unified pod (FOUP) can cause unacceptable particle and oxide formation during such extended exposure.

One possible approach to minimizing wafer exposure to the clean room atmosphere is to use low capacity (e.g. 1 to 7 wafers) loadlock chambers. A small capacity loadlock chambers has less internal volume and, thus, can be purged much more quickly than a large capacity loadlock chamber. However, the reduced capacity of the loadlock chamber creates additional disadvantages. For instance, if up to 50 wafers (i.e. two full cassettes or FOUPs) arrive at the system at once, then many of the wafers will remain in the clean room or front end interface environment for a significant amount of time while the system processes wafers in small number lots.

Accordingly, the preferred embodiments employ a low capacity loadlock chamber in conjunction with higher capacity, but low volume purgeable buffer station in order to, among other goals, alleviate the throughput and contamination disadvantages of using low capacity loadlock chambers.

Preferred buffer stations also employ racks having reduced pitch or spacing between the shelves or slots forming the rack, relative to the standard pitch in a cassette or FOUP designed for the same size substrates. A feature of these reduced pitch racks is that they allow the volume of a buffer station to be reduced in order to allow the station to be more quickly purged. The height of the uppermost slot is thus low enough to be reached within the vertical range of a standard robot. Such a standard robot is commercially available, for example, from Asyst Technologies, Inc. of Fremont, Calif. Such a robot has a vertical range of less than 30.5 cm. Use of such a standard robot and a reduced pitch buffer station rack obviates the use of elevator mechanisms to vertically shift the racks in order to reach all of the rack positions within the robot's vertical or "z" range, and also obviates modifying the robot to have greater vertical reach.

Although in certain situations using a single wafer end effector is sufficient to transfer wafers among the storage racks of the preferred embodiment (FOUP, buffer station and loadlock racks), in other situations this practice is too slow. With the use of single wafer end effectors the transfer of each wafer requires a complete cycle. A cycle is defined as picking up a wafer from a first station and depositing the wafer in a second station, and then returning to the first station. Therefore, an entire cycle must be completed in order to transfer one wafer, thus requiring 25 cycles to transfer 25 wafers. In modern high input wafer fabrication systems, the total number of cycles required to transfer a large number of wafers can be a significant throughput limiting factor, especially where process times are short and wafer handling is the limiting factor. In an industry in which the speed of processing is directly related to output, the additive effect of these additional handling steps can significantly slow down the fabrication line. For example, if each cycle takes 12 seconds, it could take 300 seconds before the 25th wafer is transferred. Moreover, the wafer remains exposed to the clean room or the FOUP environment in the interim, subject to oxidation.

Accordingly, a preferred embodiment also employs a multi-wafer transport system that significantly decreases the amount of time required to transport a group of wafers (e.g., a five wafer transfer system would cut the total transfer time of 25 wafer by 80%). Multiple wafer end effectors are described below with respect to FIGS. 5–7B.

Referring now to FIG. 1, an overhead plan view shows a semiconductor process tool 5 constructed in accordance with a preferred embodiment of the invention. A cassette, particularly a FOUP 10, is located on a front end interface (FEI) loading platform 12, the FOUP 10 being removably docked with docking port 14. Preferably, the FOUP 10 is a front opening unified pod (FOUP). Interior to the FOUP 10 is a cassette rack 16 with individual slots 17 (FIG. 2A), each slot 17 capable of holding a wafer 20. The FOUP 10 is joined with a first wafer handling chamber which is configured to operate at standard atmospheric pressure, here an atmospheric front end (AFE) chamber 22. The FOUP 10 is also selectively separated from chamber 22 by FOUP doors 23. In the AFE chamber 22 is a robot arm 24 having an end effector 26, the end effector 26 comprising one or more substrate supports 28, each capable of holding a wafer 20 for transport. In alternate arrangements, the end effector could be a fork, paddle, edge grip, vacuum or Bernoulli wand, among other configurations readily apparent to the skilled artisan. The robot arm 24 is configured to be capable of accessing wafers 20, which are located on the cassette rack 16 through a docking port 14, in combination with an elevator mechanism (not shown) for raising and lowering FEI loading platform 12.

The robot arm 24 is further configured to allow access to a buffer station 30. The buffer station 30, which is preferably separated from the AFE chamber 22 by buffer station doors 13, preferably has both pump down and purging capabilities facilitated by a purge valve 34 and gas inlet 36. In one preferred embodiment, the buffer station 30 has a reduced pitch buffer station rack 38 (FIG. 2B) interior to the buffer station 30. The buffer station rack 38 is formed from slots 18 (FIG. 2B) or shelves, each slot 18 being capable of holding a single wafer 20; however, the reduced pitch buffer station rack 38 has closer relative spacing between the slots 18 as compared with the relative spacing of the slots 17 in the cassette rack 16.

It should also be understood that in other arrangements of the process tool, the position which the buffer station occupies is advantageously used for a completely different function, such as replacing the buffer station with a pre-processing station or a post-processing station, with minimal increase in the size of the tool footprint. For example, the buffer station can be replaced by a pre-clean station, such as an etch station, or a post-processing station where processes such as annealing or the deposition of other layers, such as a sealing oxide layer, are conducted. In yet other arrangements, the buffer station is capable of being replaced by a metrology tool without the need to substantially change the system configuration.

A loadlock chamber 40, preferably a low-capacity loadlock chamber, is also adjoined to the AFE chamber 22, the loadlock chamber 40 being accessed by the robot arm 24 via a gate valve or door 42. The loadlock chamber 40 is located to serve as a selectively closeable passageway between the AFE chamber 22 and a wafer handling chamber (WHC) 44, with a gate valve or door 42 on each end of the loadlock chamber 40. In alternate embodiments the load lock 40 can lead directly to a process chamber. Inside the loadlock chamber 40 is a loadlock rack 46 (FIG. 2C). The loadlock rack 46 is composed of individuals slots 19 (FIG. 2C) or shelves, each capable of holding a single wafer. The buffer station 30 is preferably located in a position between the FOUP 10 and the loadlock chamber 40.

Figure 2A:
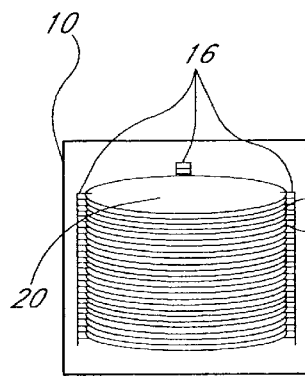
FIG. 2A is a schematic top and front perspective view of a cassette rack having standard pitch, or relative spacing between shelves, in accordance with the preferred embodiment, where the FOUP doors are not shown.
Figure 2B:
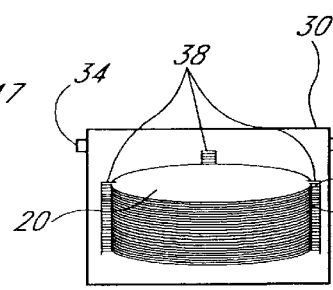
FIG. 2B is a schematic top and front perspective view of a buffer station having a reduced pitch, or relative spacing between shelves, in accordance with the preferred embodiment, where the buffer station doors are not shown.
Figure 2C:
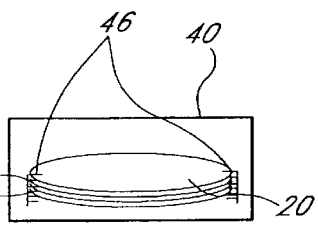
FIG. 2C is a schematic top and front perspective view of an embodiment employing a low capacity loadlock chamber having a rack with standard pitch, in accordance with the preferred embodiment, where the FOUP doors are not shown.

FIGS. 2A, 2B, and 2C illustrate the differences in the relative spacing of the racks employed in preferred embodiments of the present invention. Note that the figures are not drawn to scale. FIG. 2A shows the standard FOUP 10 with 25 individual slots 17 or shelves, each capable of holding a wafer 20.

FIG. 2B shows the buffer station 30 with the buffer station rack 38 designed to have 25 slots 18, each slot 18 capable of holding a single wafer 20. The slots 18 or shelves forming the buffer station rack 38 preferably have closer relative spacing than the cassette rack 16 of the FOUP 10. More preferably, the relative spacing of the buffer station slots 18 is between about 0.5 cm and 0.7 cm. Most preferably, the relative spacing between the buffer station slots 18 is approximately 0.584 cm. In addition, the buffer station 30 preferably has a volume of less than about 18.3 liters, more preferably less than about 16.5 liters. It will be understood, however, that certain advantages of the structures and processes discussed herein can be achieved with a buffer station rack with relative spacing equal to the relative spacing of the slots forming cassette rack 16. Preferably, the FOUP 10 holds a maximum capacity of 25 wafers 20, while the preferred capacity of the buffer station 30 is also 25 wafers 20, although alternate embodiments can have lower or higher capacities. For example, in alternate embodiments the FOUP has a maximum capacity of 13 wafers, while the buffer station has a corresponding maximum capacity of 13 wafers. Thus, in general, it is preferred that the maximum capacity of the buffer station is selected to equal the maximum capacity of the FOUP from which the wafers are transferred after docking with the process tool.

FIG. 2C shows the loadlock chamber 40 and its loadlock rack 46 including individual slots 19, each slot 19 capable of holding a single wafer 20. Although the loadlock chamber 40 is shown with three slots 19, greater or lesser capacity can be employed in other arrangements. Preferably, the loadlock rack 46 is designed to hold one to seven wafers 20, more preferably the loadlock rack 40 is designed to hold two to six wafers 20. Preferably, the loadlock chamber 40 is a low capacity load loadlock having a volume of less than about 7.325 liters and, more preferably, less than about 9.156 liters. The relative spacing of the slots 19 forming the loadlock rack 46 are preferably designed to operatively correspond with the relative spacing of the cassette rack slots 17 or, in an alternate embodiment, with the reduced pitch buffer station rack slots 18. In yet other alternate embodiments, the relative spacing of the slots 19 forming the loadlock rack 46 is not set to operatively correspond with either the spacing of the cassette rack slots 17 or the buffer station rack slots 18, but is rather set at a reduced pitch or spacing relative to both. In addition, although the FOUP 10 is preferably designed to hold a standard FOUP load of 25 wafers, in other embodiment cassettes are designed to hold less than 25 wafers, while in yet other embodiments cassettes are designed to hold more than 25 wafers.

Figure 3A:
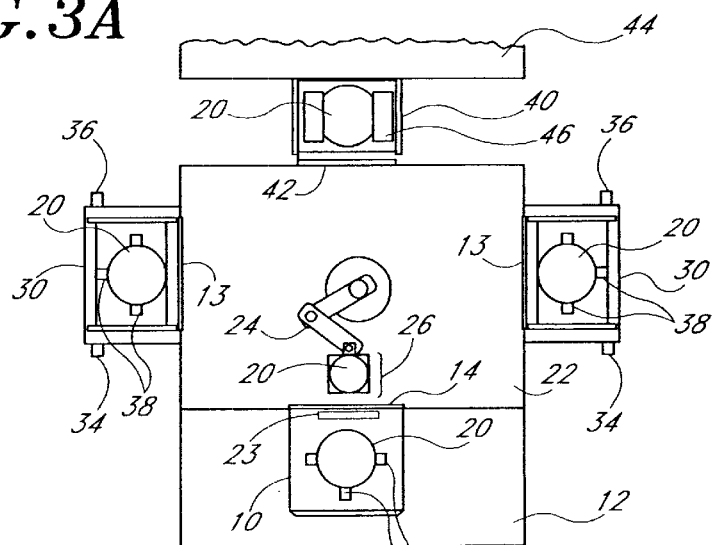
FIG. 3A is a schematic plan view of a process tool, illustrating the position of a robot arm when accessing a cassette rack, relative to a buffer station and a lowcapacity loadlock chamber.
Figure 3B:
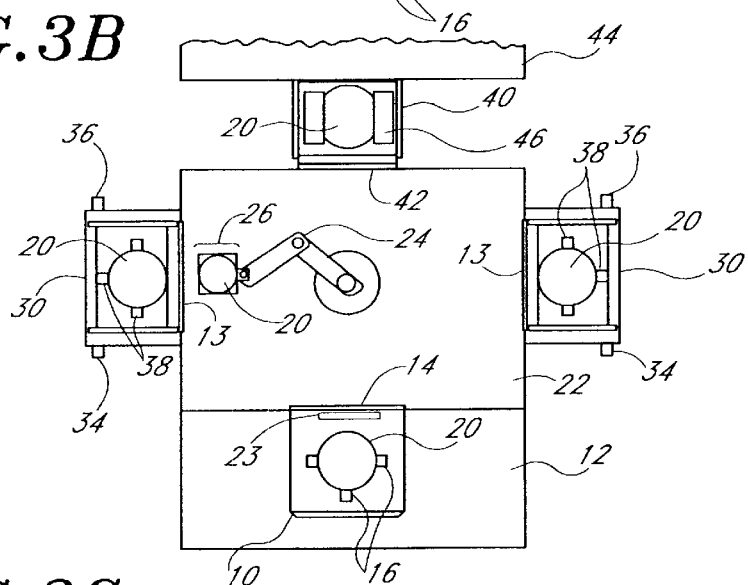
FIG. 3B shows the process tool of FIG. 3A, illustrating the position of the robot arm when accessing the reduced pitch buffer station rack.
Figure 3C:
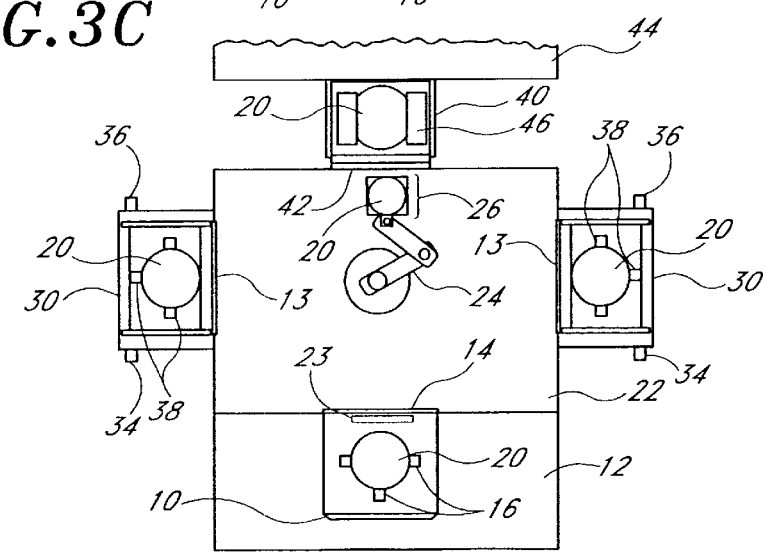
FIG. 3C shows the process tool of FIG. 3A, illustrating the position of the robot arm when accessing the loadlock chamber.

Referring now to FIGS. 3A, 3B, and 3C, an overhead plan view of a substrate fabrication tool is shown, further illustrating relative positions of the robot arm 24 with respect to the cassette rack 16, the buffer station rack 38, and the loadlock rack 46. The robot arm 24 is shown in FIG. 3A proximate to the cassette rack 16, while the robot arm 24 shown in FIG. 3B is positioned for accessing the buffer station rack 38. In FIG. 3C, the robot arm 24 is shown in a position for accessing the loadlock rack 46. Although the cassette rack 16, the buffer station rack 38, and the loadlock rack 46 are shown with a particular number of slots or shelves, it should be understood that the number of slots or shelves may vary depending upon the particular goals of the system.

With reference still to FIGS. 3A–3C, the operation of the embodiments shown in FIG. 1 and FIGS. 2A–2C preferably begins with a FOUP 10 of wafers 20 arriving at the docking port 14 of an AFE chamber 22. Referring to FIG. 3A, a robot arm 24 located inside the AFE chamber 22 preferably moves the end effector 26 through the docking port 14 and locates the end effector 26 proximate to a cassette rack 16 contained within the FOUP 10. The robot arm 24 then removes the wafer 20 from the cassette rack 16. As shown in FIG. 3B, the robot arm then locates the end effector 26 proximate to the buffer station 30. The robot arm 24 then transfers the wafer 20 into the buffer station rack 38. Preferably this transfer of the wafer 20 from the cassette rack 16 to the buffer station rack 38 is done immediately upon the docking of the FOUP 10 with the front docking port 14. The robot arm 24 similarly unloads each wafer 20 into a slot 18 (FIG. 2B) of the buffer station rack 38. Immediately after all of the wafers 20 from the FOUP 10 are unloaded into the buffer station 30, the door 13 separating the buffer station from the atmospheric front end (AFE) chamber 22 is closed in order to minimize contamination. Preferably, once the wafers 20 are in the buffer station rack 38, the buffer station 30 is then pumped down and purged to create an inert environment in which to store the wafers 20. In preferred embodiments, after unloading a wafer the robot arm 24 returns to the cassette rack 16 for the number of cycles required to transfer all of the wafers 20 from the FOUP 10 into the buffer station 30, as described above. In alternate embodiments, the robot may access the loadlock chamber between steps of transferring wafers from the cassette rack to the buffer station rack.

Once the desired number of wafers 20 have been transferred from the cassette rack 16 to the buffer station rack 38, the robot arm 24 unloads wafers 20 from the buffer station rack 38 and places the wafers 20 onto the loadlock rack 46, as needed for processing. Preferably, wafers 20 in need of processing are unloaded in the loadlock rack 46 by the robot arm 24, while those wafers which have already been processed are preferably shuttled back to the buffer station rack 38 on the robot arm's return trip. In one arrangement, processed wafers are stored in a one buffer station 30, while unprocessed wafers are stored in a separate buffer station 30 on the other side of the AFE chamber 22. The robot arm 24 preferably is programmed to continue to cycle between the buffer station 30 and the loadlock 40 until all wafers 20 are processed, before transferring wafers 20 back to the cassette rack 16.

In alternate embodiments the robot arm and end effector are programmed to transfer a wafer from the loadlock rack and directly return the wafer to a cassette rack. In another embodiment, the buffer station includes an oxygen source (not shown) connected to the gas inlet 36 (FIG. 1) in addition to a system controller (not shown) which is programmed to facilitate the growing of an additional layer upon the wafer. In this embodiment, the wafer, after being processed, is transferred from the loadlock to the buffer station for the purpose of growing an additional layer on the wafer, such as an oxide layer which is formed after growing an epitaxial layer. In this case, the oxide can serve as a functional layer (e.g., gate oxide) or as a protective layer to prevent contamination of the epi layer.

Figure 4:
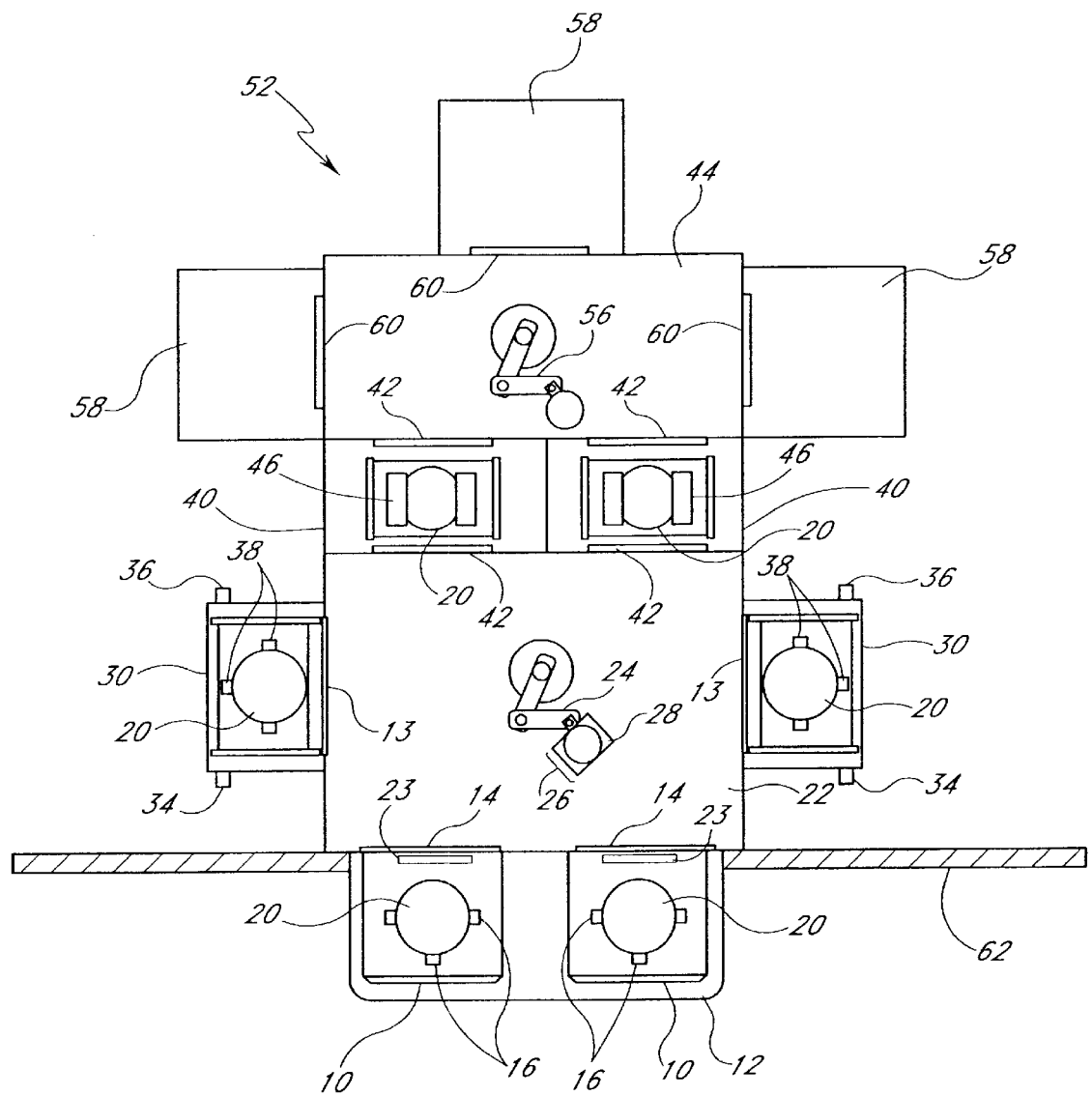
FIG. 4 is an overhead schematic of a fabrication tool, constructed in accordance with another preferred embodiment of the present invention.

Referring now to FIG. 4, an overhead schematic of a fabrication tool 52 is shown having two buffer stations 30. At the input/output region of the fabrication tool 52, a front end interface (FEI) loading platform 12 is located. On this FEI loading platform 12, two cassettes 10 are located and mated with dual front docking ports 14 on the front of the fabrication tool 52. These front docking ports 14 lead into an AFE chamber 22 in which an robot arm 24 is positioned in order to have access to the cassette racks 16 that are contained inside the cassettes 10. Each cassette rack 16 employs multiple slots 17 (FIG. 2A), each capable of holding an individual wafer 20. The cassettes 10 are preferably capable of being sealed off from the AFE chamber 22 by closing the FOUP doors 23. The illustrated tool 52 also includes two buffer stations 30 and two load lock chambers 40. The robot arm 24 is configured to effectively access each of the buffer stations racks 38 and the loadlock rack 46, the buffer stations 30 being located between the cassettes 10 and the loadlock chambers 40.

Each buffer station 30 contains a buffer station rack 38, preferably with a low pitch relative to standard cassettes for the same size wafers, as described with respect to the previous embodiment. Preferably, each buffer station 30 also employs a purge valve 34 and gas inlet 36 for purging and pumping down the interior of the buffer station 30. Similarly, the buffer stations 30 preferably also possess doors 13 which allow the chamber to be selectively sealed from the AFE chamber 22.

Inside each of the loadlock chambers 40 is a loadlock rack 46, preferably a low capacity loadlock rack. Behind the loadlock chambers is a wafer handling chamber (WHC) 44, in which a WHC robot 56 is positioned to have effective access to both the loadlock chambers 40 and the interior of a plurality of individual process chambers 58. The loadlock chambers 40 and the process chambers 58 are also preferably selectively sealable from the WHC chamber 44 through the use of gate valves 60. In preferred embodiments, a clean room wall 62 defines a "gray room" environment to which wafers are not exposed while the cassettes 10 are located on the clean room side of the wall 62, which is cleaner. In an alternate embodiment, the clean room wall 62 may be placed closer to the process chambers 58 or completely absent from the fabrication tool setup.

Figure 5:
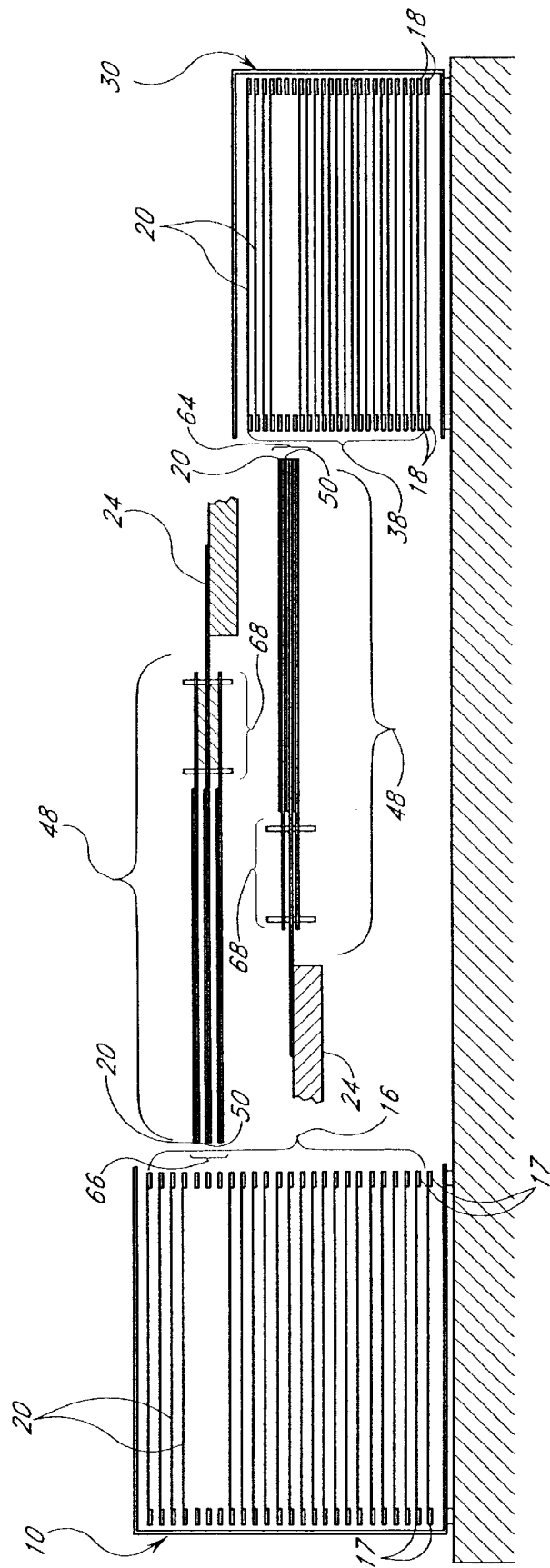
FIG. 5 shows the cassette rack and the reduced pitch buffer station rack of FIGS. 2A and 2B, respectively, in relation to a variable pitch end effector, constructed in accordance with a preferred embodiment of the invention.

Referring now to FIG. 5, a robot arm 24 is shown having a variable pitch multi-wafer end effector 48. The variable pitch end effector 48 has individual end effector supports 50, each capable of holding an individual wafer 20. The cassette rack 16 and the reduced pitch buffer station rack 38 are shown side-by-side in order to compare the relative spacing of the individual shelves or slots forming the respective racks. In addition, the robot arm 24 is shown in a reduced pitch position 64 and in a standard pitch position 66 relative to the respective racks. In the end effector's standard pitch position 66, the relative spacing of the end effector substrate supports 50 is adjusted by a variable pitch mechanism 68 to operatively correspond with the relative spacing of the slots 17 of the standard cassette (FOUP) rack 16. In addition, the relative spacing of the variable pitch end effector supports 50 in the end effector's reduced pitch position 64 is selected to facilitate the unloading and loading of wafers 20 to and from the slots 18 forming the reduced pitch buffer station rack 38.

In operation, the variable pitch multi-wafer end effector 48 preferably functions in a manner similar to the embodiment shown in FIG. 3A–3C but, in addition, the end effector 48 and a system controller (not shown) are configured and programmed so that more than one wafer 20 can be transferred at a time using the variable pitch end effector 48 between racks having different respective pitches. For example, the end effector 48 in the illustrated embodiment is configured to transfer three wafers at a time, while in alternate embodiments the end effector 48 is configured to transfer five wafers at a time. In yet other embodiments, the end effector is configured to transfer a number of wafers which is based on both the number of wafers arriving at the system and the capacity of the buffer station and/or the loadlock chamber.

Referring again to FIG. 5, in embodiments employing a variable pitch multi-wafer end effector 48, the robot arm 24 is preferably further programmed to place the variable pitch end effector 48 in its standard pitch position 64 when accessing the FOUP 10. Preferably, the robot arm 24 is also further programmed to place the variable pitch end effector 48 in its reduced pitch position 64 when the accessing the buffer station 30. In addition, when the variable pitch end effector 48 is proximate to either rack, the system controller is preferably programmed so that the variable pitch mechanism 68 has already adjusted the relative spacing of the end effector supports 50 to reflect the relative spacing of slots of the respective rack. More preferably, the pitch of the end effector supports 50 is adjusted while the variable pitch end effector is in motion between racks.

Although in preferred embodiments the cassette rack, buffer station rack and loadlock rack all support individual wafers by using slots, it should be understood that alternate embodiments can employ shelves or other suitable wafer support structures which facilitate the desired relative spacing between wafers. Also, though end effectors 48 are illustrated as underlying wafers (e.g., paddle), the skilled artisan will appreciate that other types of end effectors (e.g., edge grip, Bernoulli wand, etc.) can be employed with a variable pitch mechanism.

With reference to FIGS. 6A and 6B, an embodiment of the variable pitch end effector is shown in which the variable pitch mechanism 68 comprises cams 70 and restraining springs 72. The cams 70 are preferably located between the substrate supports 50, and more preferably, as in the embodiment shown in FIG. 6A and 6B, between rigid members to which the supports 50 are attached. In the standard pitch position 66 (FIG. 6A), the cams 70 are rotated to have a major dimension vertically oriented, overcoming the force of the restraining springs 72 and causing the end effector supports 50 to have standard pitch for accessing a FOUP. In FIG. 6B, the cams 70 are rotated to the reduced pitch position 64 with the major dimension horizontally oriented, which allows the retaining springs 72 to push the substrate supports 50 closer together in order that they have reduced pitch (i.e., reduced relative spacing). Although the embodiment shown in FIGS. 6A and 6B has three substrate supports 50, it should be understood that the number of substrate supports can be less than three or greater than three, depending on the size of the racks to be accessed and the desired efficiencies of the wafer fabrication process.

Figure 7A:
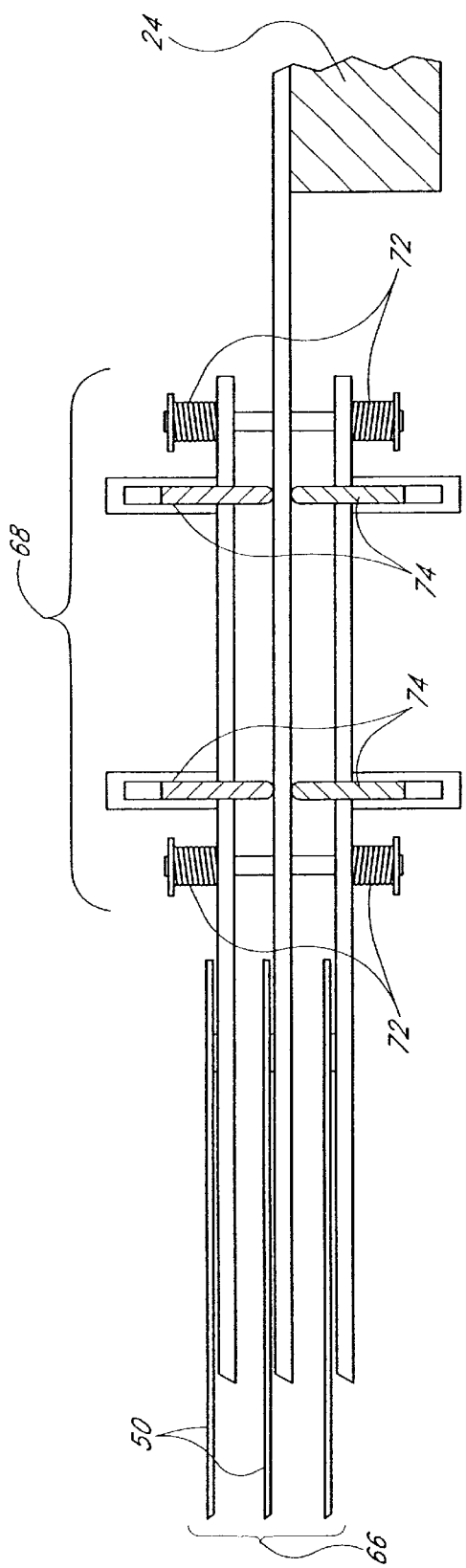
FIG. 7A shows a variable pitch end effector employing linear actuators, in accordance with another embodiment, shown in a standard pitch position.
Figure 7B:
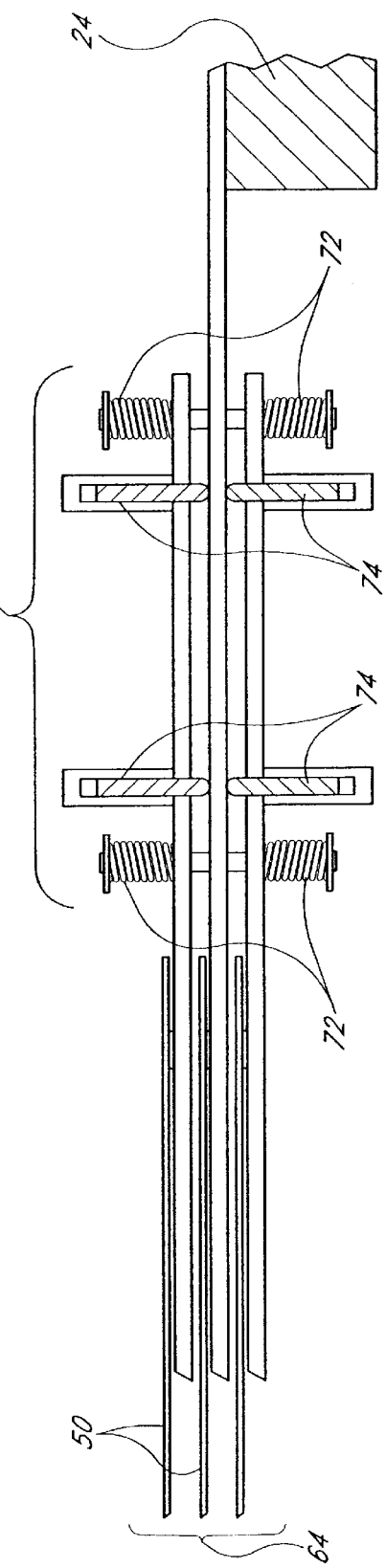
FIG. 7B shows the variable pitch end effector of FIG. 7A, shown in a reduced pitch position.

Referring now to FIGS. 7A and 7B, an alternate method of effecting variable pitch in a variable pitch end effector is shown. In FIG. 7A, linear actuators 74 are shown in the standard pitch position 66. In preferred embodiments, the linear actuators 74 are pneumatic, while in alternate embodiments the linear actuators are electric. The force exerted by the linear actuators 74 is counter-balanced by restraining springs 72 so that, when the linear actuators 74 are retracted into the reduced pitch position 64 (FIG. 7B), the restraining springs 72 reduce the relative spacing of the supports 50. Although the embodiment shown in FIGS. 7A and 7B has three substrate supports 50, it should be understood that the number of substrate supports can be less than three or greater than three, depending on the size of the racks to be accessed and the desired efficiencies of the wafer fabrication process.

Note that while illustrated and discussed in conjunction with the buffer station having a reduced pitch relative to a FOUP, the skilled artisan will readily appreciate that the variable pitch end effectors and methods described herein are applicable to transfer among a variety of racks having different pitches from one another. For example, the adjustable pitch end effector could be used to transfer wafers between a FOUP and a shipping container, the container having a different pitch relative to the FOUP.

Figure 8:
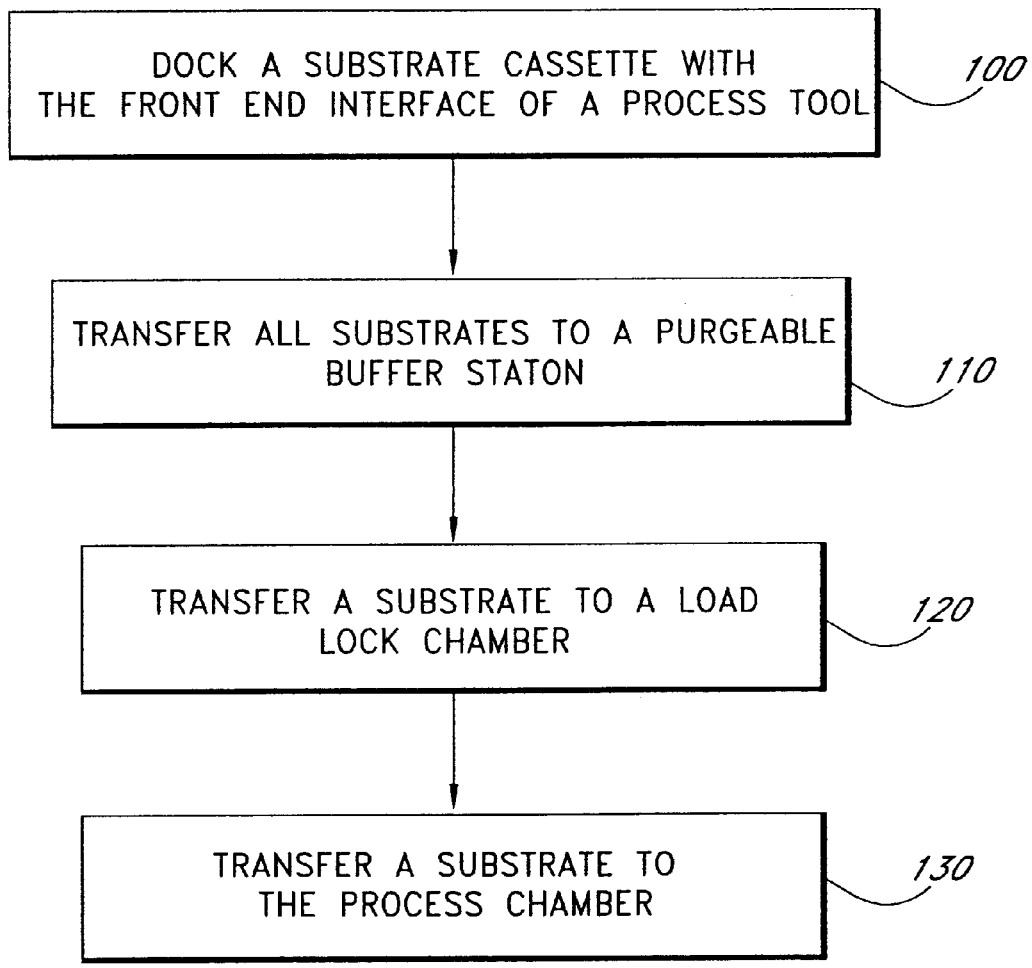
FIG. 8 is a flowchart showing a method of processing wafers employing a cassette, a buffer station, and a loadlock chamber, in accordance with the preferred embodiments.

A preferred method of fabricating integrated circuits is shown in FIG. 8, comprising the docking 100 of a substrate cassette with the front docking ports of a process tool. Preferably all of the substrates in the cassette are immediately transferred 110 to a purgeable buffer station. More preferably, all substrates are transferred to the buffer station within about 40 seconds of docking the cassette with the front docking port of the process tool, and most preferably within about 15 seconds. Next, the buffer station is closed and purged 120 in order to create an inert environment in which to store the substrates. In this way, the wafers are not subjected to the moisture and oxygen of the clean room environment while waiting for processing, minimizing opportunity for oxidation or other contamination of the substrates. One or more of the substrates is then transferred 130 from the buffer station to a loadlock chamber by a robot arm preferably after the entire cassette rack has been unloaded into the buffer station rack. Preferably, multiple wafers are simultaneously transferred. The substrate(s) is (are) then transferred 140 from the loadlock chamber to a process chamber of a process tool.

A feature of certain preferred embodiments of the present invention is that the facilitation of a quick transfer of a load of wafers arriving at a docking port from the atmosphere in the cassette to an inert environment within the purgeable buffer stations.

Another feature of certain preferred embodiments of the present invention is the use of reduced pitch buffer racks which enable buffer stations to have smaller volumes, thus enabling faster purging of the interior of the buffer station subsequent to a load of wafers arriving. This feature increases throughput and minimizes the level of contamination to which individual wafers are subjected.

Yet another advantage of certain embodiments of the present invention is the facilitation of the simultaneous transfer of multiple wafers between racks having unequal pitch or spacing relative to one another. These pitch differences enable the use of standard pitch cassettes with both low volume buffer stations and loadlock chambers, which are more easily purged. In addition, preferred embodiments also minimize the exposure of a wafer to contaminating particles.

An additional feature of certain embodiments of the present invention is the use of reduced pitch buffer station racks in order to facilitate a robot arm accessing the entire reduced pitch buffer station rack through the use of the robot arm's z-motion alone without necessitating an internal elevator mechanism and the added complexity and potential contamination caused by elevator mechanisms.

Although this invention has been disclosed in the context of certain preferred embodiments and examples, it will be understood by those skilled in the art that the present invention extends beyond the specifically disclosed embodiments to other alternative embodiments and/or uses of the invention and obvious modifications thereof. Thus, it is intended that the scope of the present invention herein disclosed should not be limited by the particular disclosed embodiments described above, but should be determined only by a fair reading of the claims that follow.

We claim:

1. A method of fabricating an integrated circuit comprising:

docking a substrate cassette with a front docking port of a process tool;

transferring a substrate to a buffer station located between the docking port and a loadlock chamber;

purging the buffer station; and moving the substrate from the buffer station to the loadlock chamber.

2. The method according to claim 1, wherein all substrates within the substrate cassette are transferred to the buffer station within about 40 seconds of docking the cassette with the front docking port of the process tool.

3. The method according to claim 1, wherein all substrates contained within the cassette are transferred to the buffer station before native oxide growth occurs on surfaces of the substrates.

4. The method according to claim 1, wherein the substrate is transferred from the substrate cassette, through a first handling chamber, and into the buffer station operatively joined with the first handling chamber.

5. The method according to claim 1, wherein substantially all substrates in a cassette are first unloaded from the cassette and transferred to the buffer station before the substrates contained in the buffer station are transferred to the loadlock chamber.

6. The method according to claim 1, further comprising transferring a substrate from the docked cassette to a stationary reduced pitch rack in the buffer station using a robot arm.

7. The method according to claim 1, further comprising simultaneously transferring multiple substrates, using a robot arm having a variable pitch end effector, from a rack of the docked cassette to a buffer station rack of the buffer station having a different pitch relative to the cassette rack.

8. The method according to claim 7, wherein a relative spacing between shelves in the variable pitch end effector is adjusted to operatively correspond with a pitch of shelves in the cassette rack prior to the end effector accessing the cassette rack.

9. The method according to claim 7, wherein a relative spacing of shelves in the variable pitch end effector shelves is adjusted to operatively correspond with a pitch of shelves in the buffer station rack prior to the end effector accessing the buffer station rack.

10. The method according to claim 7, wherein a relative spacing between shelves of the variable pitch end effector is adjusted while the variable pitch end effector is in route between destinations.

11. The method according to claim 1, further comprising delivering a processed substrate from the loadlock chamber to the buffer station subsequent to processing in a process chamber.

12. The method according to claim 11, further comprising growing a functional layer on a surface of the processed substrate in the buffer chamber.

13. A method of fabricating an integrated circuit comprising:

docking a substrate cassette with a front docking port of a process tool, the cassette containing a load of substrates;

transferring all of the substrates contained within the cassette to a buffer station;

purging the buffer station; and moving the substrates from the buffer station to the loadlock chamber after transferring all of the substrates.

14. The method of claim 13, wherein transferring all of the substrates contained within the cassette to the buffer station is conducted within about 40 seconds of docking the cassette with the front docking port of the process tool.

* * * * *